(12) United States Patent
Kuo et al.

(10) Patent No.: US 8,410,856 B2
(45) Date of Patent: Apr. 2, 2013

(54) METHOD AND APPARATUS FOR CANCELING BALUN AMPLIFIER NOISE

(75) Inventors: Ming-Ching Kuo, Yizhu Township (TW); Yi-Shing Shih, Changhua (TW); Shih-Hao Tarng, Kaohsiung (TW)

(73) Assignee: Industrial Technology Research Institute, Chutung Hsinchu (TW)

( * ) Notice: Subject to any disclaimer, the term of this patent is extended or adjusted under 35 U.S.C. 154(b) by 286 days.

(21) Appl. No.: 12/971,307

(22) Filed: Dec. 17, 2010

(65) Prior Publication Data
US 2012/0154056 A1  Jun. 21, 2012

(51) Int. Cl.
*H03F 3/04* (2006.01)

(52) U.S. Cl. .......................... 330/301; 330/102; 330/149

(58) Field of Classification Search .................. 330/301, 330/102, 149
See application file for complete search history.

(56) References Cited

U.S. PATENT DOCUMENTS

| | | | |
|---|---|---|---|
| 4,216,435 A * | 8/1980 | Ahmed | 330/254 |
| 5,404,050 A | 4/1995 | Nauta | |
| 6,271,721 B1 * | 8/2001 | Trask | 327/560 |
| 6,366,171 B1 | 4/2002 | Litmanen et al. | |
| 6,542,037 B2 * | 4/2003 | Noll et al. | 330/301 |
| 6,608,527 B2 | 8/2003 | Moloudi et al. | |
| 6,809,594 B2 | 10/2004 | Sutardja | |
| 7,378,911 B2 | 5/2008 | Ismail et al. | |
| 7,671,685 B2 | 3/2010 | Chang | |
| 7,671,686 B2 | 3/2010 | Kuo et al. | |
| 7,737,789 B2 | 6/2010 | Eisenstadt et al. | |
| 7,777,575 B2 | 8/2010 | Stockinger et al. | |
| 7,948,322 B2 * | 5/2011 | Lee | 330/301 |
| 8,138,835 B2 * | 3/2012 | Zeng et al. | 330/296 |

OTHER PUBLICATIONS

Blaakmeer et al., "Wideband Balun-LNA With Simultaneous Output Balancing, Noise-Canceling and Distortion-Canceling", IEEE Journal of Solid-State Circuits, vol. 43, No. 6, Jun. 2008, pp. 1341-1350.
Bruccoleri et al., "Wide-Band CMOS Low-Noise Amplifier Exploiting Thermal Noise Canceling", IEEE Journal of Solid-State Circuits, vol. 39, No. 2, Feb. 2004, pp. 275-282.
Bult et al., "A Class of Analog CMOS Circuits Based on the Square-Law Characteristic of an MOS Transistor in Saturation", IEEE Journal of Solid-State Circuits, vol. SC-22, No. 3, Jun. 1987, pp. 357-365.
Im et al., "A Wideband CMOS Low Noise Amplifier Employing Noise and IM2 Distortion Cancellation for a Digital TV Tuner", IEEE Journal of Solid-State Circuits, vol. 44, No. 3, Mar. 2009, pp. 686-698.
Liao et al., "A Broadband Noise-Canceling CMOS LNA for 3.1-10.6-GHz UWB Receivers", IEEE Journal of Solid-State Circuits, vol. 42, No. 2, Feb. 2007, pp. 329-339.
Woo et al., "A 3.6mW Differential Common-Gate CMOS LNA with Positive-Negative Feedback", 2009 IEEE International Solid-State Circuits Conference, Feb. 2009, pp. 218-220.

\* cited by examiner

*Primary Examiner* — Patricia Nguyen
(74) *Attorney, Agent, or Firm* — Ditthavong Mori & Steiner, P.C.

(57) ABSTRACT

The noise figure of a low noise amplifier (LNA) is reduced without sacrificing performance such as gain, IIP3, and wideband impedance matching. Embodiments include configuring a control module of the LNA to sum and scale an output from a current-sensing branch of the LNA and an output from a voltage sensing branch of the LNA into one or more summed and scaled outputs. The control module also feeds the one or more summed and scaled outputs back to at least one of the outputs of the branches of the LNA.

20 Claims, 15 Drawing Sheets

FIG. 9

| Ref. | Summing & Scaling | | | 1st Conventional Approach | 2nd Conventional Approach | 3rd Conventional Approach | 4th Conventional Approach |
|---|---|---|---|---|---|---|---|
| Architecture | Type-I | Type-II | Type-III | Balun | Single-ended | Diff. | Single-ended |
| Freq. [GHz] | 0.1-2 | 0.15-2 | 0.1-2 | 0.2-5.2 | 0.2-2 | 0.3 - 0.92 | 0.05-1.0 |
| Av Gain [dB] | 23.6 | 23.2 | 24 | 15.6 | 14 | 21 | N/A |
| NF [dB] | 1.5-2.25 | 1.75-2 | 1.75-2.2 | 2.8-3.5 | 1.9-2.4 | 3 * | 3.0-3.3 |
| IIP3 [dBm] | 1.3 | 2.3 | -1.7 | 0 | 0 | -3.2 | +3 |
| S11 [dB] | <-10 | <-10 | <-10 | <-10 | -8 | -10 | <-9 |
| Supply [V] | 1.2 | 1.2 | 1.2 | 1.2 | 2.5 | 1.8 | 2.2 |
| Power [mW] | 3.5 | 3.5 | 3.5 | 14 | 35 | 3.6 | 35 |
| Technology | 0.13µm | 0.13µm | 0.13µm | 65nm | 0.25µm | 0.18µm | 0.18µm |
| Area [mm²] | - | - | - | 0.009 | 0.075 | 0.33 ** | 0.16 |

900

1000

METHOD AND APPARATUS FOR CANCELING BALUN AMPLIFIER NOISE

BACKGROUND

Broadband communications are emerging for wireline and wireless communications, such as DVB-H (470-890 MHz), cognitive radios (0.1-10 GHz), etc. A low-noise amplifier (LNA) circuit may be placed at the first stage of an entire receiver. Thus, the properties of low-noise amplifier circuits directly impact the performance of the receiver. Current challenges arising in handling wide-spectrum capacities include designing LNAs with wideband input match and gain bandwidth. However, conventional approaches to achieve these performance requirements incur a poor noise figure (NF).

The desired frequency span can be processed by one LNA circuit or by several LNA circuits each for processing a smaller band. A single-ended LNA is efficient because antennas and RF filters usually produce single ended signals, and conserves area, power, and costs. On the other hand, differential signaling in the receive chain reduces second-order distortion and rejects power supply and substrate noise. At some point in the receive chain, a balun may be used to convert the single-ended RF signal into a differential signal.

By way of example, a single-input differential-output low-noise on-chip amplifier, i.e., a balun LNA, facilitates connection to the front antenna and to the following mixer of a double balanced topology. A balun is a type of electrical transformer that converts electrical differential signals balanced about ground to unbalanced (single-ended) signals and vice versa. A low-noise amplifier (LNA) is an electronic amplifier used to amplify very weak signals (for example, captured by an antenna). FIG. 1 is a block diagram depicting an example of a single-stage balun LNA composed by common-gate (CG) common-source (CS) amplifiers. The balun LNA eliminates the need of an off-chip balun in front of the LNA, and provides a low noise feature and low external BOMs (bill-of-materials). In addition, the balun LNA does not require an on-chip balun after the LNA, such that it is effective for low distortion as well as low power consumption. FIG. 2 is a simplified schematic of the CG-CS balun amplifier to show the noise transfer functions of FIG. 1. A common-gate amplifier is typically used as a current amplifier, while a common-source amplifier is typically used as a voltage or transconductance amplifier.

The common-gate (CG) amplifier as shown in FIG. 2 is applied for its wideband impedance match. The problems of a noise figure (NF) greater than 3.5 dB and an insufficient voltage gain are alleviated by the parallel common-source (CS) amplifier. When the CG and CS amplifiers are equally sized, the noise figure of the CG-CS balun amplifier is still too high.

Noise figure (NF) is a measure of degradation of the signal-to-noise ratio (SNR), caused by components in a radio frequency (RF) signal chain. The noise figure is defined as the ratio of the output noise power of a device to the portion thereof attributable to thermal noise in the input termination at standard noise temperature $T_0$ (usually 290 K). The noise/distortion from $M_{CG}$ (M1) is canceled by taking the output differentially. The $M_{CS}$ (M2) noise dominates the NF. Thereafter, the parallel CS amplifier doubles the voltage gain and cancels the noise and distortions generated from the CG amplifier. The CG-CS input stage also naturally performs single-to-differential conversion, which may be provided a low-cost implementation without an extra off-chip balun.

Referring to FIG. 2, assuming the CG and CS branches are symmetrical, i.e., $g_{m,CG}=g_{m,CS}$ and $R_{L1}=R_{L2}=R_L$, the overall noise figure of the entire balun LNA can be approximated by:

$$F = 1 + \frac{g_{m,CG}R_s}{|T_{i,R_s}|}\left\{\left(\frac{\gamma}{\alpha}\right)\cdot(|T_{i,CG}|^2 + |T_{i,CS}|^2) + \frac{2}{g_{m,CG}R_L}\right\} \quad (1)$$

Where $g_{m,CG}$ and $g_{m,CS}$ respectively represent the transconductance of the CG and CS amplifiers. Transconductance ($g_m$), also known as mutual conductance, is the ratio of the current change at the output port to the voltage change at the input port. $R_{L1}$ and $R_{L2}$ respectively represent the resistor loads of the CG and CS branches. Rs is the source resistance and equal to 50 ohm. $T_{i,CG}$ and $T_{i,CS}$ respectively denote the current transfer gains in the differential outputs due to the CG and CS transistor noise currents, i.e., $i_{n,M1}$ and $i_{n,M2}$ are respectively shown as follows:

$$i_{n,M1} = 4kT\left(\frac{\gamma}{\alpha}\right)\cdot g_{m1}, \; i_{n,M2} = 4kT\left(\frac{\gamma}{\alpha}\right)\cdot g_{m2} \quad (2)$$

Where $\gamma/\alpha$ represents the transistor's excess noise factor, and $T_{i,Rs}$ represents the transfer gain in the differential output due to the Rs noise current, i.e., $i_{n,Rs}$.

$$i_{n,Rs} = \frac{4kT}{R_s} \quad (3)$$

CG transistor channel noise $i_{n,CG}$ results in the noise currents $i_{nd1}$ and $i_{nd2}$ at the drain ports of the CG and CS amplifiers, respectively, and $T_{i,CG}$ is the difference of these two components normalized to $i_{n,CG}$. These parameters can be derived as:

$$i_{nd1} = \frac{1}{1+g_{m,CG}R_s}\cdot i_{n,CG} \quad (4)$$

$$i_{nd2} = g_{m2}\cdot i_{nd1} R_s = \frac{g_{m,CS}R_s}{1+g_{m,CG}R_s}\cdot i_{n,CG} \quad (5)$$

It is noted that $i_{nd1}$ and $i_{nd2}$ are of the same sign. Assuming two branches are symmetrical, i.e., $g_{m,CG}=g_{m,CS}$ and $R_{L1}=R_{L2}$, and the noise current gain $i_{nd1}/i_{n,CG}=k$, the other current gain $i_{nd2}/i_{n,CG}=(1-k)$. On the other hand, the noise current gain resulting from the CS transistor channel noise ($i_{n,CS}$) at the drain ports of CG and CS is 0 and 1, respectively.

The balun LNA provides a voltage gain of $2R_L/R_s$ as $1/g_{m,CG}=R_s$. This means the noise from the CG amplifier can be canceled due to the parallel CS amplifier since two output noise are equal, i.e., $k=(1-k)=0.5$.

Although the noise from the CG amplifier can be canceled due to the parallel CS amplifier, the overall NF is still relatively high due to the significant contribution from the CS amplifier. Based on the equation (1), the NF is as large as 3.5 dB with $R_L=400$ and $\gamma/\alpha=1$.

To minimize the noise figure in the equation (1), $|T_{i,CG}|^2 + |T_{i,CS}|^2$ should be minimized. $T_{i,CG}$ denotes the current transfer gain in the differential output due to the CG transistor noise current, i.e., $i_{n,M1}$, and can be expressed by:

$$T_{i,CG} = \frac{1}{1+g_{m,CG}R_s} - \frac{g_{m,CS}R_s}{1+g_{m,CG}R_s} \quad (6)$$

Assuming $1/(1+g_{m,CS}R_s)$ is k, then the second term $g_{m,CS}R_s/(1+h_{m,CG}R_s)$ can be expressed as $(1-k)$ since $g_{m,CG}=g_{m,CS}$. On the other hand, $T_{i,CS}$ denotes the current transfer gain in the differential output due to the CS transistor noise current, i.e., $i_{n,M2}$, and is equal to one.

$$T_{i,CG}=k-(1-k)=2k-1=0, T_{i,CS}=1 \quad (7)$$

Thus, the term, $|T_{i,CG}|^2+|T_{i,CS}|^2$ can be rewritten as $$|T_{i,CG}|^2+|T_{i,CS}|^2=|k-(1-k)|^2+|1| \quad (8)$$

To minimize the term, $|T_{i,CG}|^2+|T_{i,CS}|^2$, k=0.5. Therefore, the term, $|T_{i,CG}|^2+|T_{i,CS}|^2$, has a minimal/optimized value of one, and F=2.25 (-3.5 dB). This is what is shown in the conventional balun LNA circuit topology as depicted in FIG. 1 using CG and CS amplifiers with identical size and bias.

To improve the balun LNA of FIG. 1, a conventional approach suggested an inductorless LNA and derives conditions for simultaneous output balancing, noise canceling and distortion canceling, by admittance scaling the CS-stage with respect to the CG-stage for noise canceling. This approach obtains a noise figure in the order of 3 dB or lower. Another conventional approach suggested a feedforward thermal noise-canceling technique for a LNA, which allows for simultaneous noise and impedance matching, while canceling the noise and distortion contributions of the matching device. This approach provides wide-band impedance-matching amplifiers with a NF range of 1.9-2.4 dB, without suffering from instability issues. This is done by placing an auxiliary voltage-sensing amplifier (with a gain -Av) fed-forward to the matching stage such that the noise from the matching device cancels at the output, while adding signal contributions. In this way, the LNA noise figure is minimized at the price of power dissipation in an auxiliary amplifier. The difference in sign for noise and for signal cancels the noise of the matching device, while simultaneously adding the signal contributions. In other words, the approach creates a new output at a node added to a scaled negative replica of the voltage at another node.

However, these conventional approaches come at a cost of high power consumption (e.g., 14-35 mW) and low average gains (e.g., 14-15.6). In addition to noise figure well below 3 dB, adequate linearity, and source impedance matching, high-sensitivity integrated receivers require LNAs with sufficiently large gain to handle broadband communications while allowing some variable gains to handle interference generated by strong adjacent channels. Other approaches were proposed to overcome power and gain issues.

A third conventional approach suggested a differential common-gate LNA consisting of cross-coupled capacitors and PMOS transistors in a differential CG configuration. The differential common-gate LNA reduces the power consumption to 3.6 mW, yet providing only an average 3 dB NF in the frequency range of 0.3-0.92 GHz.

A fourth conventional approach suggested a LNA with single-ended input and output employing noise and IM2 distortion cancellation for a digital terrestrial and cable TV tuner. The single-ended LNA adopts thermal noise canceling based on current amplification, to acquire low NF (e.g., 3.0-3.3 dB) and high third-order intercept point (IIP3) performance (e.g., 3 dBm) without degradation of gain and wideband input matching. In telecommunications, a third-order intercept point (IIP3 or TOI) is used to measure weakly nonlinear systems and devices (e.g., receivers, linear amplifiers and mixers, etc.). It is assumed that the device nonlinearity can be modeled using a low-order polynomial. The third-order intercept point relates nonlinear products caused by the third-order nonlinear term to the linearly amplified signal.

SUMMARY

Accordingly, there exists a need to reduce the noise figure (NF) of a CG-CS balun LNA to lower than 3.5 dB without sacrificing other performance characteristics, such as gain, IIP3, and wideband impedance matching.

According to an exemplary embodiment, a noise cancelling method is provided to improve the NF, the method which comprises summing and scaling an output from a current-sensing (e.g., common-gate) branch of an amplifier and an output from a voltage sensing (e.g., common-source) branch of the amplifier into one or more summed and scaled outputs. The method may also comprise feeding the one or more summed and scaled outputs back to at least one of the outputs of the branches of the amplifier.

According to another exemplary embodiment, an apparatus is provided which comprises a current sensing amplifier and a voltage sensing amplifier. The apparatus may also comprises a control module which sums and scales an output from the current sensing amplifier and an output from the voltage sensing amplifier, wherein the control module feeds one or more summed and scaled outputs back to at least one of the outputs of the current and voltage sensing amplifiers.

According to yet another exemplary embodiment, an apparatus is provided which comprises at least one processor; and at least one memory including computer program code for one or more programs. The at least one memory and the computer program code may be configured, with the at least one processor, to cause the apparatus to perform at least the following: sum and scale an output from a current-sensing branch of an amplifier and an output from a voltage sensing branch of the amplifier into one or more summed and scaled outputs; and feed the one or more summed and scaled outputs back to at least one of the outputs of the branches of the amplifier.

The disclosure is readily apparent from the following detailed description, simply by illustrating a number of exemplary embodiments, including the best mode contemplated for carrying out the disclosure. Embodiments of the disclosure are also capable of other and different implementations, and several details thereto can be modified in various obvious respects, all without departing from the spirit and scope of the claims. Accordingly, the drawings and description are to be regarded as illustrative in nature, and not as restrictive.

BRIEF DESCRIPTION OF THE DRAWINGS

Some exemplary embodiments of the disclosure are illustrated by way of example, and not by way of limitation, in the figures of the accompanying drawings:

FIG. 9 is a performance comparison table of the simulated circuit topologies and previously discussed wideband LNAs;

DESCRIPTION OF SOME EXEMPLARY EMBODIMENTS

Examples of a method and apparatus for reducing the noise figure of low noise amplifiers are disclosed. In the following description, for the purposes of explanation, numerous specific details are set forth in order to provide a thorough understanding of the embodiments. It is apparent, however, to one skilled in the art that the embodiments of the disclosure may be practiced without these specific details or with an equivalent arrangement. In other instances, well-known structures and devices are shown in block diagram form in order to avoid unnecessarily obscuring the embodiments of the disclosure.

Figure 3:
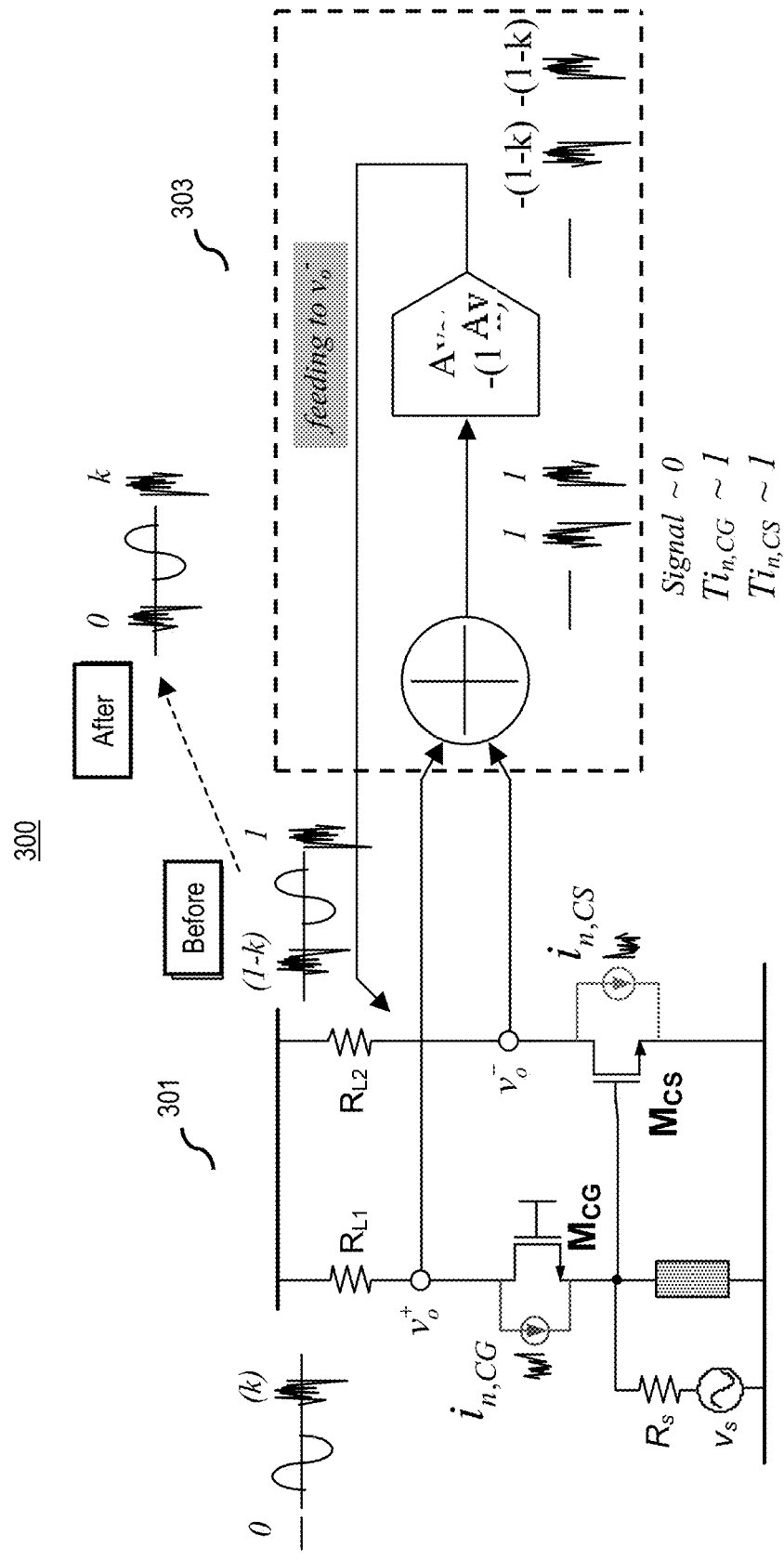
FIG. 3 is a block diagram of an exemplary embodiment of a single-stage CG-CS balun amplifier applied with a summing/scaling approach.

To overcome the issues of the above-discussed conventional approaches, the following summing/scaling approach is suggested to provide a CG-CS balun amplifier at least with a NF lower than 3.5 dB, a power consumption below 10 mW, and an IIP3 between 0-3 dBm. FIG. 3 is a block diagram of an exemplary embodiment of a single-stage CG-CS balun amplifier 301 including a control module 303 for applying a summing/scaling approach, in accordance with an exemplary embodiment. As summing the two outputs of two branches, three normalized components related to the desired signal, the CG transistor noise, and the CS transistor noise are obtained. These components reflect the factors of 0, 1, and 1 for the desired signal, the CG transistor noise, and the CS transistor noise, respectively. In other words, the current transfer function of the three components can be expressed as $T_{i,Rs}=0$, $T_{i,CG}=1$, and $T_{i,CS}=1$. After scaling through an amplifier with a gain of A, they becomes $T_{i,Rs}=0$, $T_{i,CG}=A$, and $T_{i,CS}=A$. As feeding these components back to the node of the negative output $v_o^-$, the transistors' noise term at the negative output becomes $T_{i,CG,neg}=(1-k+A)$, and $T_{i,CS}=(1+A)$.

Thus, the term, $|T_{i,CG}|^2+|T_{i,CS}|^2$ can be rewritten as:

$$|T_{i,CS}|^2+|T_{i,CS}|^2=|k(1-k+A)|^2+|1+A|^2 \qquad (9)$$

To minimize $|T_{i,CG}|^2+|T_{i,CS}|^2$, $A=-(1-k)$. Therefore, $|T_{i,CG}|^2+|T_{i,CS}|^2$ is reduced to $2k^2$.

As scaling these components through an amplifier which has a gain of $-(1-k)$ and feeding the scaled components back to the output of the CS branch, the noise components at the CS output are reduced and the signal is unchanged. As shown, the noise components become 0 and k for the CG transistor noise and the CS transistor noise, respectively. Thus, the noise current gains resulting from the CG and the CS transistor noises, respectively, become the same. A low k (i.e., a higher $g_{m,CG}$) leads to a lower NF.

By way of example, as $g_{m,CG}R_s=1$, e.g., k=0.5 to minimize $|T_{i,CG}^2+|T_{i,CS}|^2$, $A=-(1-k)=-0.5$. $|T_{i,CG}|^2+|T_{i,CS}|^2$ is thus reduced to $2k^2=0.5$, and a 2.4 dB NF is available from (1). It is noted that the minimal value of term $|T_{i,CG}|^2+|T_{i,CS}|^2$ in the conventional case as aforementioned is one and a NF of 3.5 dB. This brings an improvement of 1.1 dB compared to the conventional design of FIG. 1.

As another example, as $g_{m,CG}R_s=1.85$ ($g_{m,CG}=37$ mS), e.g., k=0.35 to minimize $|T_{i,CG}|^2+|T_{i,CS}|^2$, $A=-(1-k)=-0.65$. $|T_{i,CG}|^2+|T_{i,CS}|^2$ is further reduced to $2k^2=0.245$. The NF is further decreased to 1.76 dB, when the contribution from the feedback path is neglected. In other words, assuming $g_{m,CG}R_s=1.85$ (k=0.35, $S_{11}=-10.5$ dB), $R_L=400$, $\gamma/\alpha=1$ ($T_{i,CG}=-0.35$, $T_{i,CS}=0.35$), NF=1.5 (~1.76 dB). As such, NF is reduced by 1.74 dB as compared to the conventional case.

Since this LNA is applied in wireless applications, the input matching is dominated by the transconductance of the CG amplifier and can be expressed by:

$$S_{11} = 20\log\left|\frac{g_{m,CG}R_s - 1}{g_{m,CG}R_s + 1}\right| \qquad (10)$$

To maintain a reasonable input match, $S_{11}$ is set to be as low as −10 dB. This leads to a limit of $g_{m,CG}$ in a range of 11-38 mS. As discussed, a higher $g_{m,CG}$ can result in a better NF. However, to maintain a reasonable $S_{11}$, the $g_{m,CG}$ can be designed as 37 mS, and the corresponding NF range is 1.76 dB as aforementioned.

Figure 4:
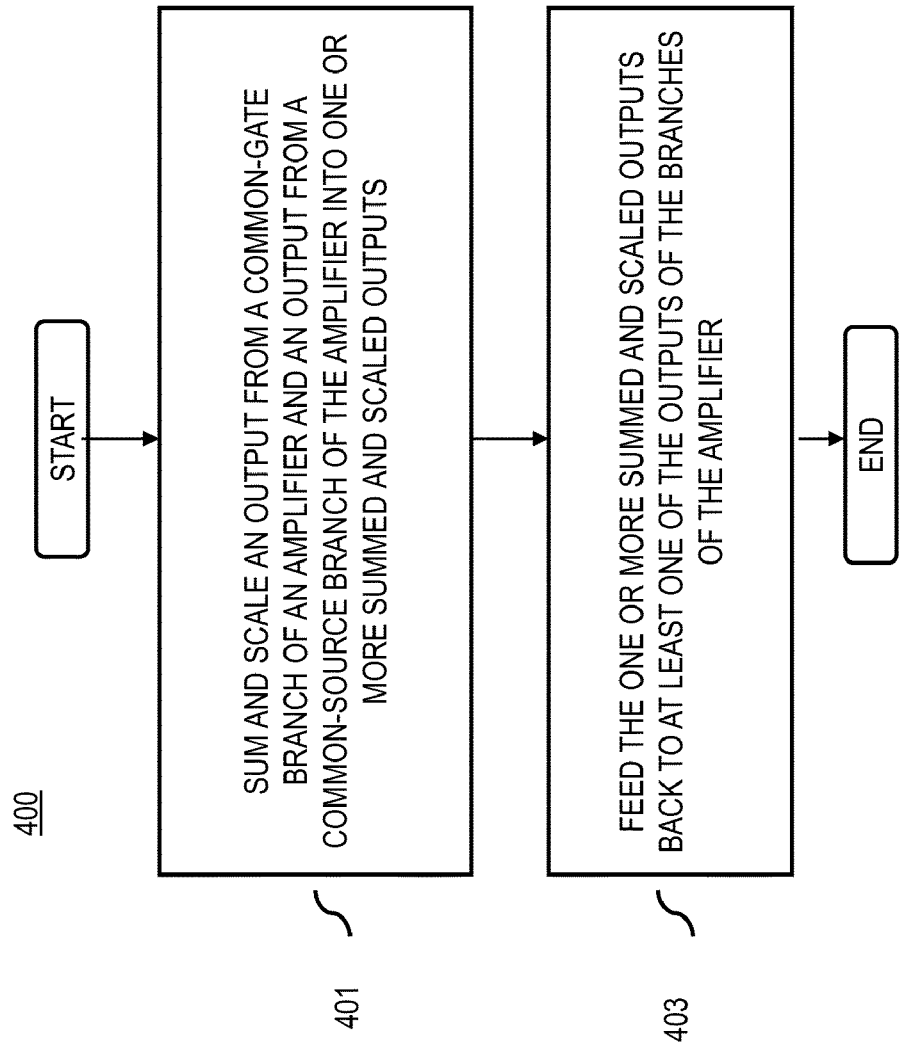
FIG. 4 is a flowchart of an exemplary embodiment of a process for reducing the noise figure of a CG-CS balun LNA without sacrificing the other performance (such as gain, IIP3, and wideband impedance matching)

FIG. 4 is a flowchart of an exemplary embodiment of a process 400 for reducing the noise figure of a CG-CS balun LNA without sacrificing the other performance (such as gain, IIP3, and wideband impedance matching), in accordance with an exemplary embodiment. This process 400, by way of example, can be performed by a control module 303 of a low noise amplifier in FIG. 3. By way of example, in step 401, the control module 303 sums and scales an output from a common-gate branch of the amplifier and an output from a common-source branch of the amplifier into one or more summed and scaled outputs. The summing and scaling may include summing the outputs from the branches and then scaling a summed result with a factor, or scaling each of the outputs from the branches with a factor and then summing scaled results. In one embodiment, the outputs from the branches are summed using one or more inductors, one or more resistors, one or more capacitors, or a combination thereof. In another embodiment, the outputs from the branches are scaled using two or more common-source amplifiers.

In step 403, the control module 303 feeds the one or more summed and scaled outputs back to at least one of the outputs of the branches of the amplifier. The feeding back may include feeding back a positive one of the one or more summed and scaled outputs to a positive one of the outputs of the branches of the amplifier, feeding back a negative one of the one or more summed and scaled outputs to a negative one of the outputs of the branches of the amplifier, or a combination thereof. In a first embodiment, a negative one of the outputs of the branches of the amplifier has an inverting phase from an input of the amplifier, and a negatively scaled one of the one or more summed and scaled outputs is fed back to the negative output. In a second embodiment, a positive one of the outputs of the branches of the amplifier has no phase shift from an input of the amplifier, and a positively scaled one of the one or more summed and scaled outputs is fed back to the positive output. In a third embodiment, the first and second embodiments are combined, to feed a negatively scaled one of the one or more summed and scaled outputs back to the negative output, and to feed a positively scaled one of the one or more summed and scaled outputs back to the positive output.

Figure 5:
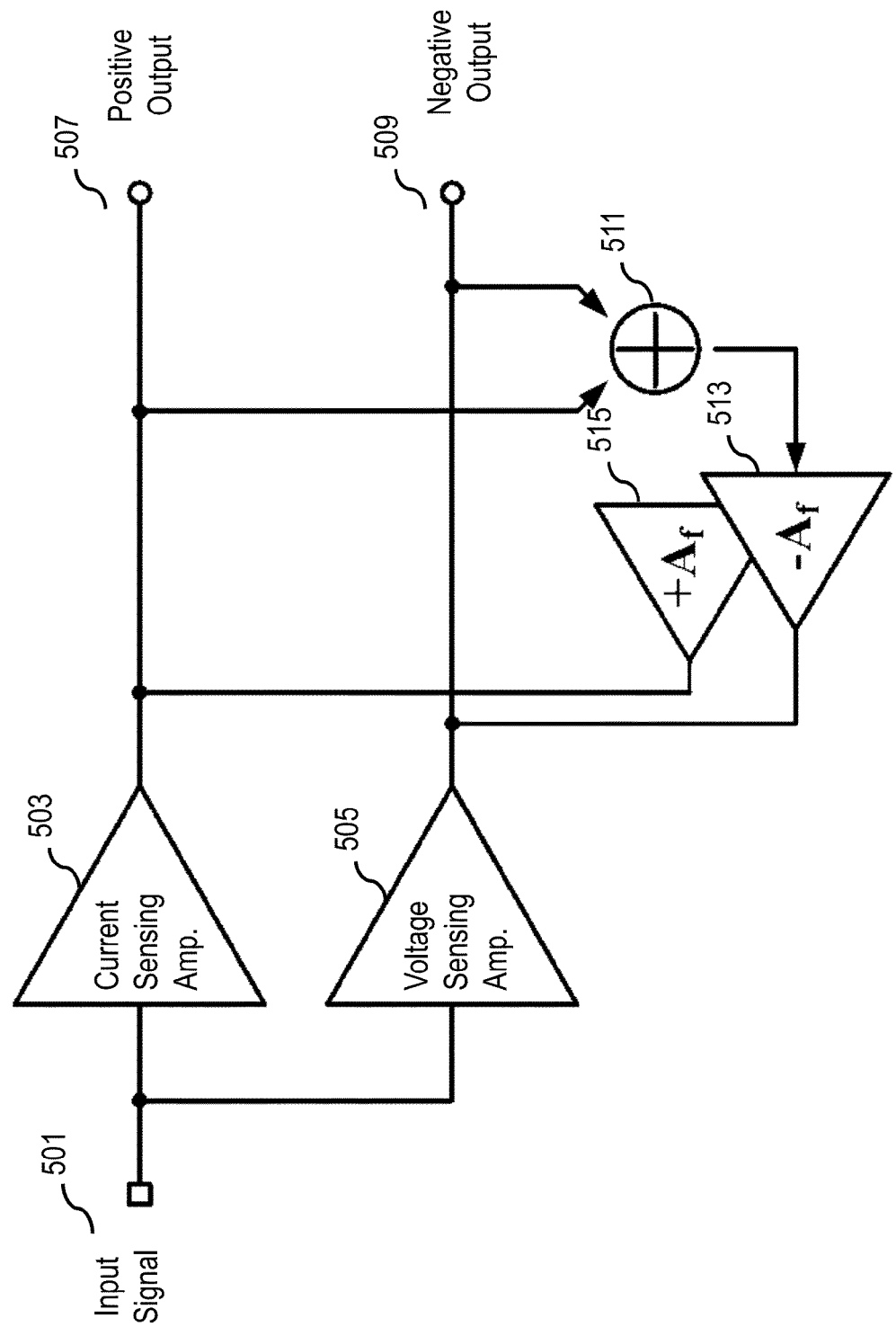
FIG. 5 shows an equivalent diagram of feedback gains implemented by the CG-CS balun amplifier of FIG. 3.

FIG. 5 illustrates equivalent diagram of feedback gains implemented by the CG-CS balun amplifier of FIG. 3, in accordance with various exemplary embodiments. The CG-CS balun amplifier of FIG. 3 includes a CG (current sensing) amplifier 503 receiving an input signal 501, a CS (voltage sensing) amplifier 505 receiving the input signal 501, and a control module.

By way of example, the control module sums an output 507 from the current sensing amplifier 503 and an output 509 from the voltage sensing amplifier 506 with a summer 511. The control module then scales the summed result with either a factor $-A_f$ using a scaler 513, a factor $+A_f$ using a scaler 515, or a combination thereof.

Thereafter, the control module feeds one or more summed and scaled outputs back to at least one of the positive and negative outputs 507, 509 of the current and sensing voltage amplifiers 503, 505. By summing two outputs of CG and CS branches and feeding this component with a factor back to one of the two outputs, the noise figure is reduced significantly. For example, when the feedback path composed of the summer 511 and the scaler 513 has an inverting phase, i.e., a 180 degree of phase shift from the input 501, the summed component is fed back to the CS branch (negative) output 509. As another example, when the feedback path has no or little phase shift, the summed component is fed back to the CG branch (positive) output 507.

The following embodiments assume that the amplifier has a transfer gain $1/(1+g_{m,CG}Rs)=k$, and $g_{m,CS}Rs/(1+g_{m,CG}Rs)=(1-k)$ if $g_{m,CG}=g_{m,CS}$. In one embodiment, when the feedback path comprises only one scaler/amplifier with a gain $-A_f$, $A_f=(1-k)$ and the gain $-A_f$ is fed back to the negative output 509. In another embodiment, when the feedback path comprises only one scaler/amplifier with a gain $+A_f$, $A_f(1-k)$ and the gain $+A_f$ is fed back to the positive output 507. In yet another embodiment, when the feedback path comprises more than one scaler/amplifier: one with gain $+A_{f1}$ and another one with a gain $-A_{f2}$, the gain $A_{f1}=k1$ and the gain $A_{f2}=k2$ are respectively fed the positive output 507 and the negative output 509, while $k1+k2=(1-k)$. The above-proposed embodiments utilize the summing and scaling approach to reduce the NF of CG-CS balun amplifiers without sacrificing the other performance such as gain, IIP3, and wideband impedance matching.

The above-discussed design examples assume $g_{m,CG}=g_{m,CS}$. In other embodiments, $g_{m,CG}$ is different from $g_{m,CS}$. The proposed summing and scaling approach is still valid, but the design considerations on determining the parameters are slightly different as discussed in conjunction with FIG. 12.

The summing and scaling approach can be applied to many types of circuit implementations. The following circuit topologies are simulated as examples in FIGS. 6-8.

Figure 6A:
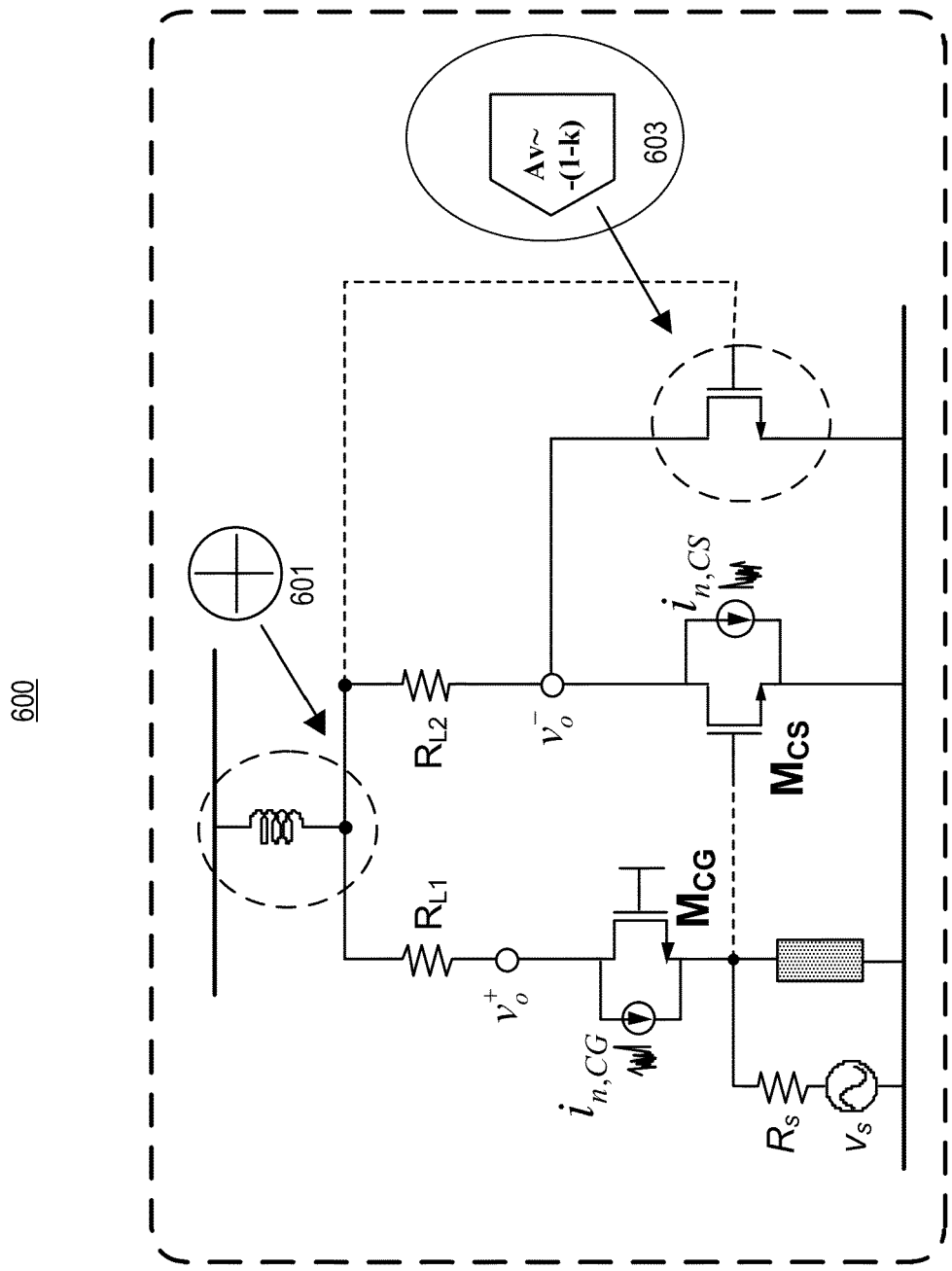
FIGS. 6A-6B show a first simulated circuit topology based on the summing and scaling approach, a NF diagram and an IIP3 diagram of the first simulated circuit topology.

A first simulated circuit topology 600 based on the summing and scaling approach is shown in FIG. 6A. In this embodiment, an inductor 601 (providing a high-impedance termination where this common-mode termination provides the summed component) is used as the summer and one CS amplifier 603 is used as the scaler. In other embodiments, one or more resistors, inductors, transistors are applied to implement this summer, and one or more amplifiers other than the CS amplifier are applied to implement this scaler. By way of example, the summed component is coupled to the input of the amplifier and then fed back to the output of the CS branch. For example, the CS amplifier 603 is scaled as $-(1-k)$ of the input of the CG-CS amplifier.

Figure 1:
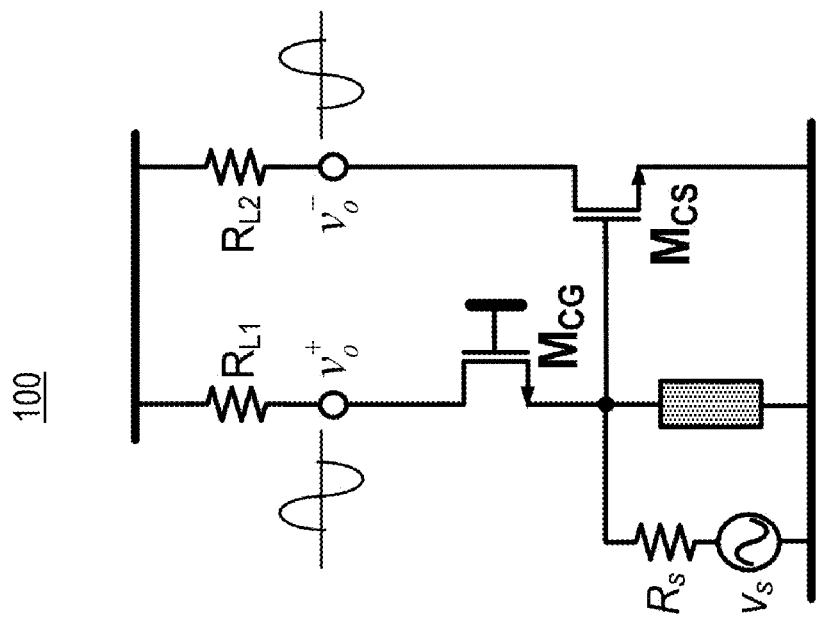
FIG. 1 is a block diagram depicting an example of a single-stage balun LNA composed by common-gate (CG) common-source (CS) amplifiers.
Figure 2:
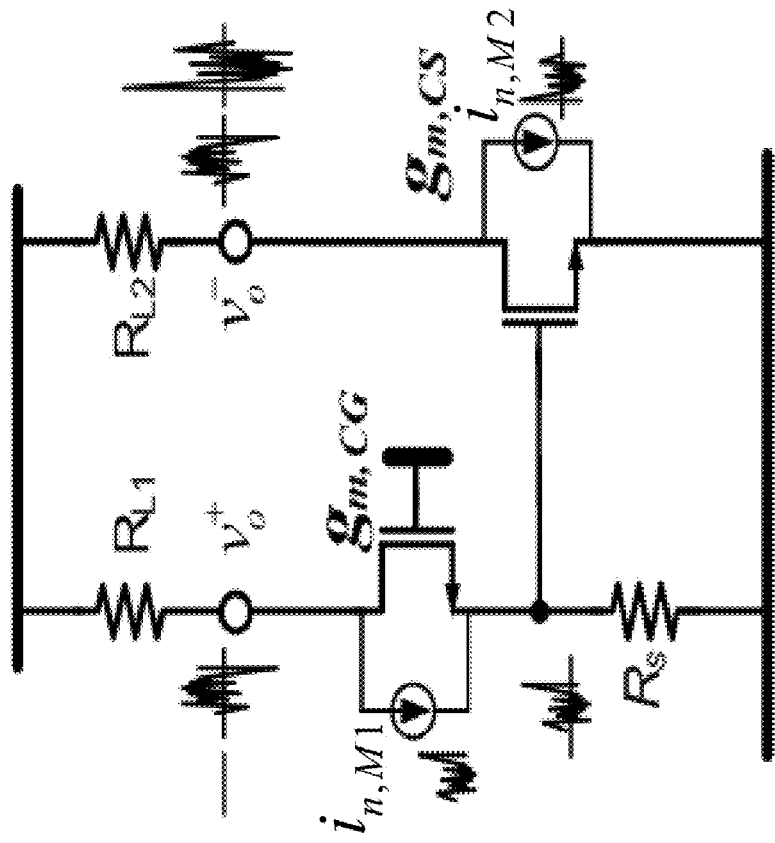
FIG. 2 shows a simulated schematic of the CG-CS balun amplifier of FIG. 1.
Figure 6B:
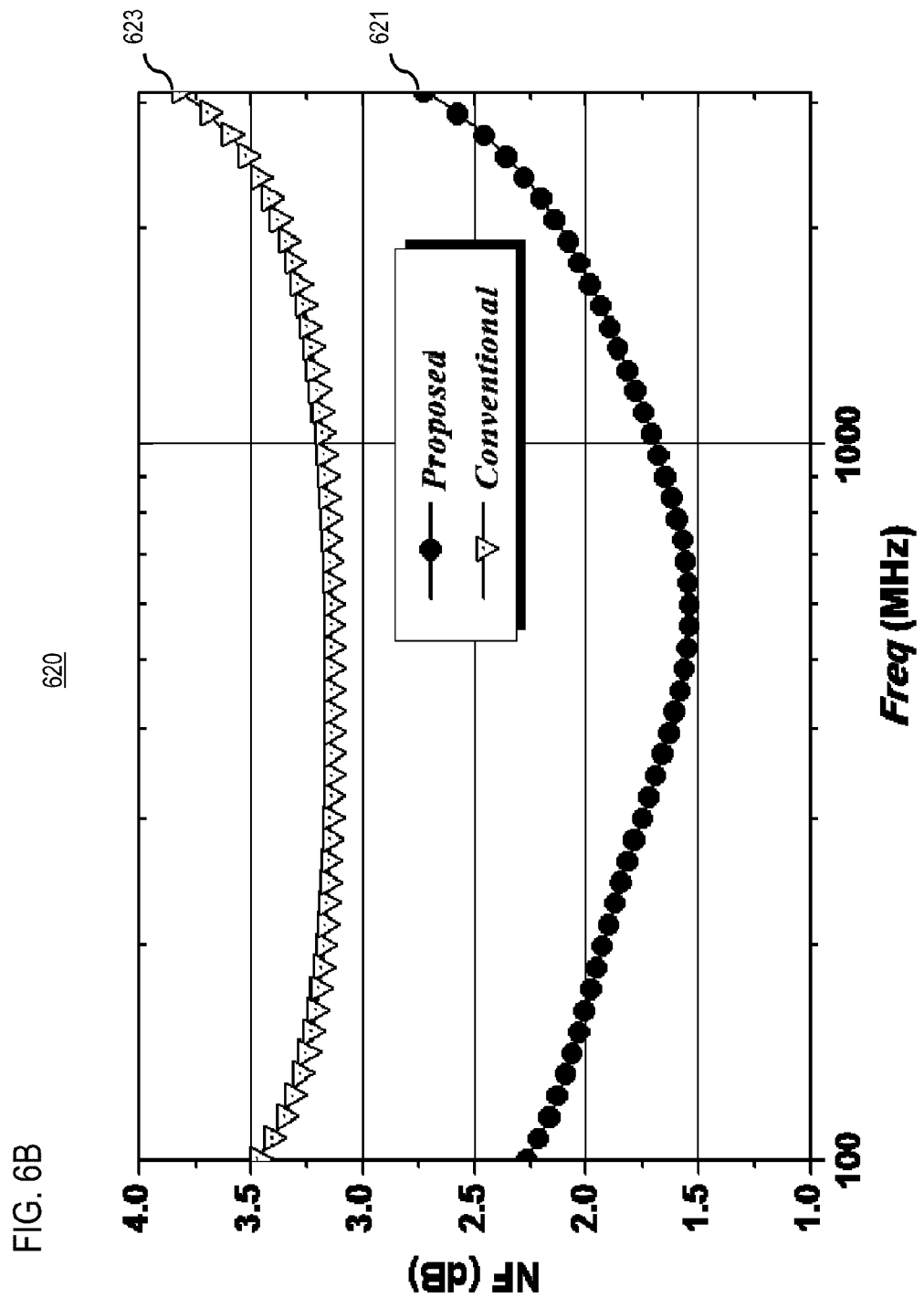

FIG. 6B shows a diagram 620 including simulated NFs of the first circuit topology versus frequency. As shown, a significant improvement is achieved due to the added feedback circuit based on the summing and scaling approach. The simulated NFs 621 based on the summing and scaling approach and the NFs 623 based on the conventional approach depicted in FIG. 1 are shown for comparisons. The results show a NF range of 1.5-2.25 dB over 0.1-2 GHz based on the summing and scaling approach, and a NF range of 3.2-3.5 dB over 0.1-2 GHz based on the conventional approach. The simulated NFs are 1.25-1.7 dB smaller than those based on the conventional approach. In addition, the trend of simulated NFs generally aligns with those of the conventional approach over the entire band. Such confirms the effect of broadband noise cancellation as well as the proposed design methodology.

Figure 7A:
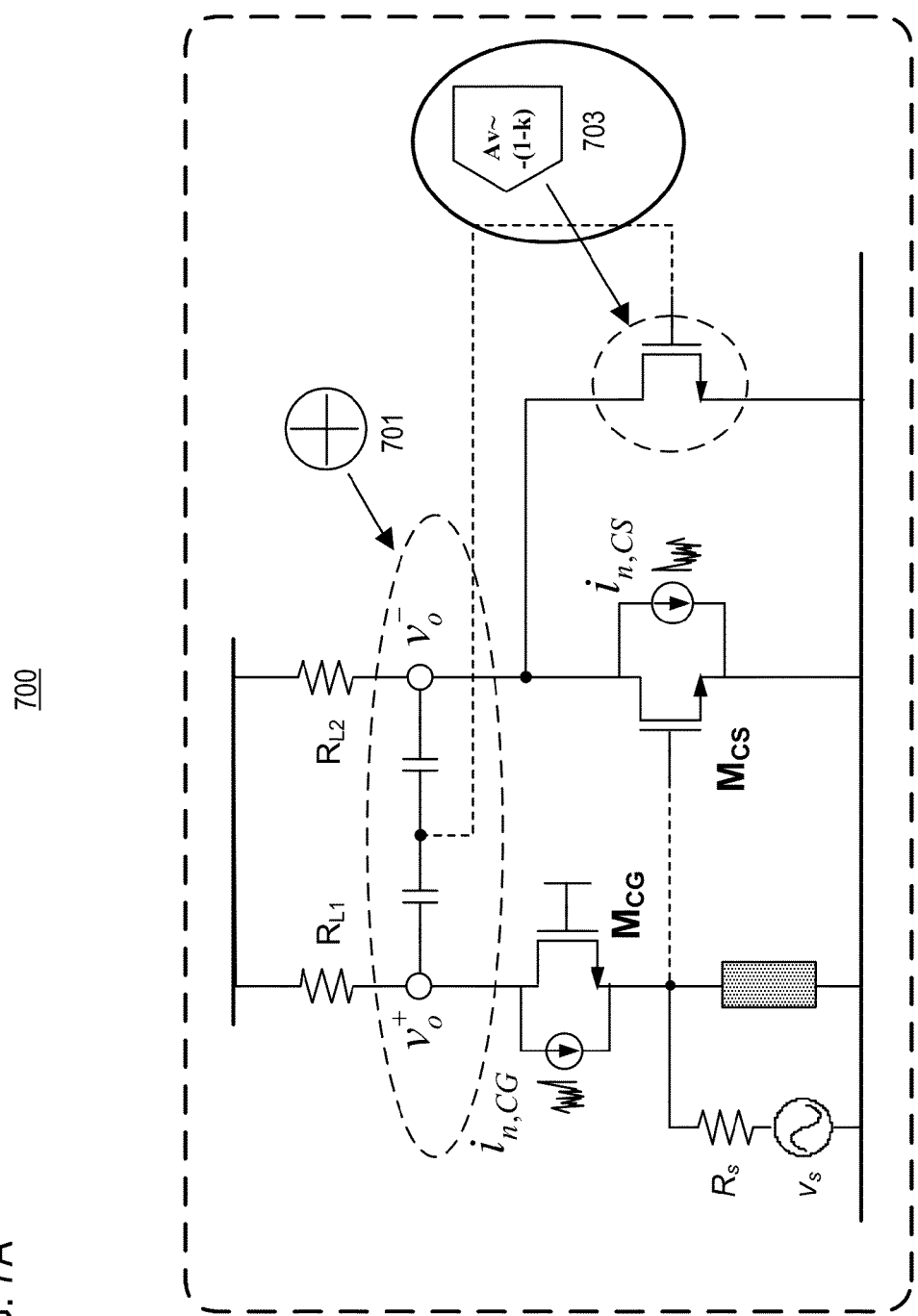
FIGS. 7A-7B show a second simulated circuit topology based on the summing and scaling approach, a NF diagram and an IIP3 diagram of the second simulated circuit topology.

The second simulated circuit topology based on the summing and scaling approach is shown in FIG. 7A. A pair of capacitors 701 is used as the summer, and one CS amplifier 703 is used as the scaler, where the common-mode termination provides the summed components. In other embodiments, one or more resistors, inductors, transistors are applied to implement this summer, and one or more amplifiers other than the CS amplifier are applied to implement this scaler. By way of example, the summed components are coupled to the input of the LNA and then feedback to the output of the CS branch.

Figure 7B:
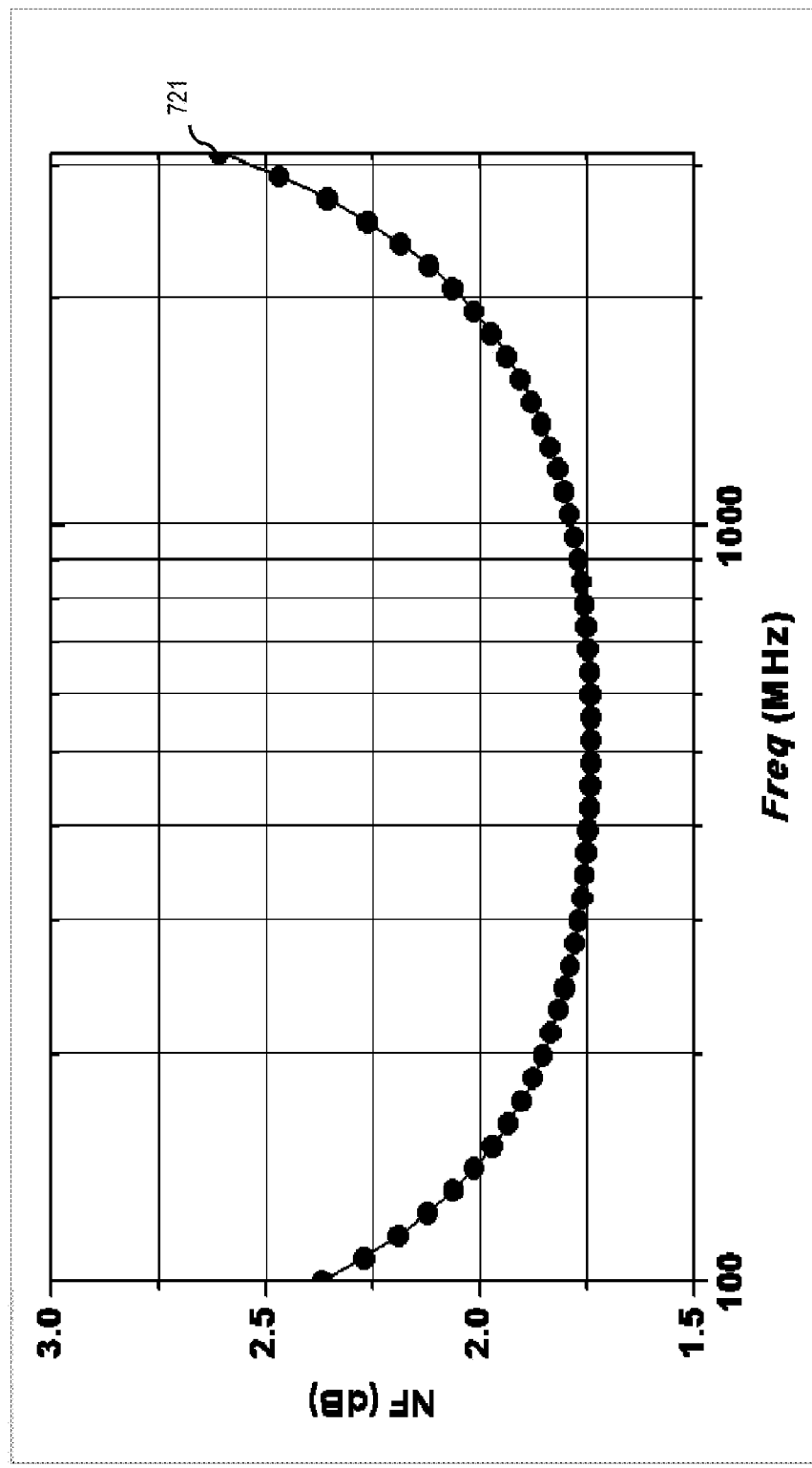

FIG. 7B illustrates a diagram 720 including simulated NFs of the second circuit topology versus frequency. As shown, a significant improvement is achieved due to the added feedback circuit based on the summing and scaling approach. The simulated NFs 721 based on the summing and scaling approach shows a NF range of 1.75 dB and below 2 dB from 150 MHz to 2 GHz, while the conventional approach has a NF range of 3.2-3.5 dB over 0.1-2 GHz. The simulated NFs are 1.15-1.7 dB smaller than those of the conventional approach.

Figure 8A:
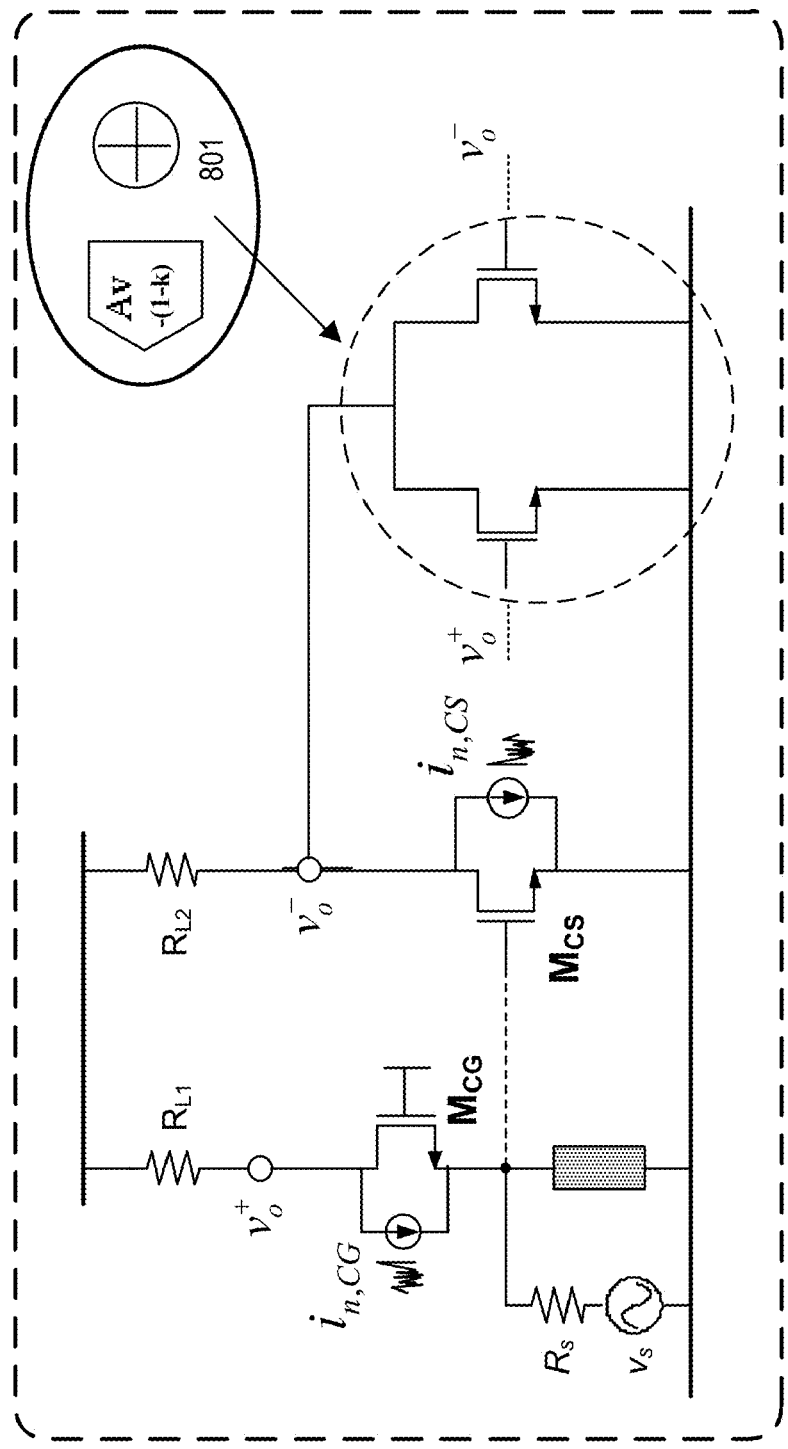
FIGS. 8A-8B show a third simulated circuit topology based on the summing and scaling approach, a NF diagram and an IIP3 diagram of the third simulated circuit topology.

The third simulated circuit topology based on the summing and scaling approach is illustrated in FIG. 8A. Different from the first and second topologies, this circuit topology scales the components of two outputs and then sums the scaled components. A pair of CS amplifiers 801 is used to scale feedback factors and then sum the scaled results together at the output of the CS branch.

Figure 8B:
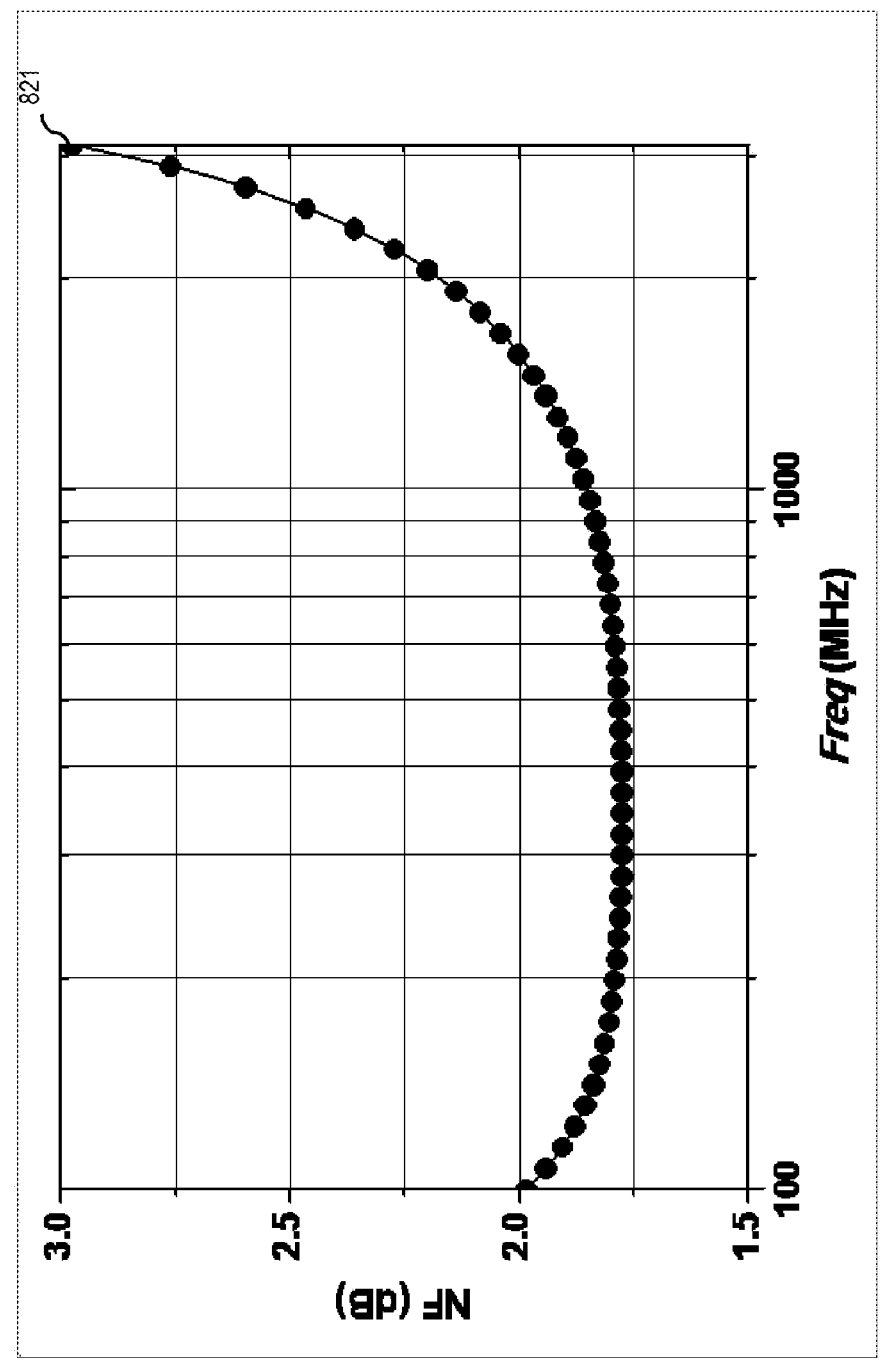

FIG. 8B illustrated a diagram 820 including simulated NFs of the third circuit topology versus frequency. As shown, a significant improvement is achieved due to the added feedback circuit based on the summing and scaling approach. The simulated NFs 821 based on the summing and scaling approach shows a NF of 1.75 dB and a NF range of below 2 dB from 100 MHz to 1.5 GHz, while the conventional approach has a NF range of 3.2-3.5 dB over 0.1-2 GHz. The simulated NFs are 1.15-1.7 dB smaller than those of the conventional approach. Unlike the previous two circuit topologies which send a null signal into the feedback amplifier; the third circuit topology sends the output signal directly to the feedback amplifier and introduces additional distortions.

FIG. 9 is a performance comparison table of the simulated circuit topologies and previously discussed conventional wideband LNAs. The simulated performance of LNAs based on the summing and scaling approach is summarized in the Table of FIG. 9. Other previously discussed conventional wideband LNAs are included in the Table for comparisons. The proposed summing and scaling approach and circuit topologies benefit from high bandwidth, low average NF over the entire band, and small die area with moderate power consumption. By way of example, the proposed summing and scaling approach and circuit topologies can achieve specific requirements in ultra-low voltage/power (ULVP) microsystems, biomedical applications, wireless sensor networks (WSN), high-speed circuits, etc. For these applications, the proposed summing and scaling approach and circuit topologies can achieve ultra-low power consumption (<400 µW, NF<4 dB), ultra-low voltage operation (<0.5V), ultra wideband operation (>9 GHz), Balun LNA/fully differential LNA reconfigurability.

The above described advantages may be applied to any low noise amplifiers, including, but not limited to single-stage CG-CS balun-LNAs. Any balun amplifiers composed of a current-sensing amplifier and voltage-sensing amplifier and any balun amplifiers with a post-stage of amplifiers are applicable. Also, the processes described herein for reducing the noise figure of a CG-CS balun LNA without sacrificing the other performance (such as gain, IIP3, and wideband impedance matching) may be advantageously implemented via software, hardware, firmware or a combination of software and/or firmware and/or hardware. With this approach, the noise figure of a CG-CS balun LNA is reduced without sacrificing the other performance (such as gain, IIP3, and wideband impedance matching). The processes described herein may also be implemented with an Application Specific Integrated Circuit (ASIC), Field Programmable Gate Arrays (FPGAs), etc.

Figure 10:
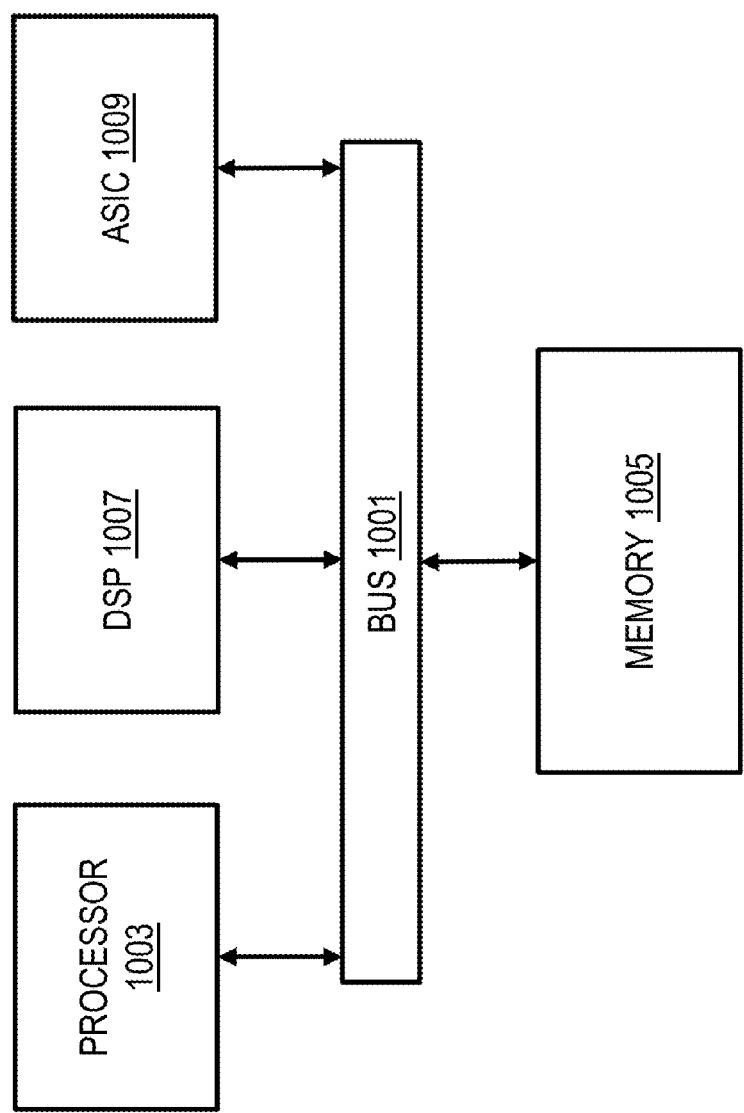
FIG. 10 is a diagram of a chip set that can be used to implement various exemplary embodiments.

FIG. 10 is a diagram of a chip set that can be used to implement various exemplary embodiments. Chip set 1000 is programmed for reducing the noise figure of a LNA without sacrificing the other performance (such as gain, IIP3, and wideband impedance matching) as described herein and includes, for instance, the processor and memory components incorporated in one or more physical packages (e.g., chips). By way of example, a physical package includes an arrangement of one or more materials, components, and/or wires on a structural assembly (e.g., a baseboard) to provide one or more characteristics such as physical strength, conservation of size, and/or limitation of electrical interaction. It is contemplated that in certain embodiments the chip set 1000 can be implemented in a single chip. It is further contemplated that in certain embodiments the chip set or chip 1000 can be implemented as a single "system on a chip." It is further contemplated that in certain embodiments a separate ASIC would not be used, for example, and that all relevant functions as disclosed herein would be performed by a processor or processors. Chip set or chip 1000, or a portion thereof, performs one or more steps for controlling a direct current gain of a resonant converter to increase power efficiency within a circuit.

In an embodiment, the chip set or chip 1000 includes a communication mechanism such as a bus 1001 for passing information among the components of the chip set 1000. A processor 1003 has connectivity to the bus 1001 to execute instructions and process information stored in, for example, a memory 1005. The processor 1003 may include one or more processing cores with each core configured to perform independently. A multi-core processor enables multiprocessing within a single physical package. Examples of a multi-core processor include two, four, eight, or greater numbers of processing cores. Alternatively, or in addition, the processor 1003 may include one or more microprocessors configured in tandem via the bus 1001 to enable independent execution of instructions, pipelining, and multithreading. The processor 1003 may also be accompanied with one or more specialized components to perform certain processing functions and tasks such as one or more digital signal processors (DSP) 1007, or one or more application-specific integrated circuits (ASIC) 1009. A DSP 1007 typically is configured to process real-world signals (e.g., sound) in real time independently of the processor 1003. Similarly, an ASIC 1009 can be configured to performed specialized functions not easily performed by a more general purpose processor. Other specialized components to aid in performing the inventive functions described herein may include one or more field programmable gate arrays (FPGA) (not shown), one or more controllers (not shown), or one or more other special-purpose computer chips.

The processor 1003 and accompanying components have connectivity to the memory 1005 via the bus 1001. The memory 1005 includes both dynamic memory (e.g., RAM, magnetic disk, writable optical disk, etc.) and static memory (e.g., ROM, CD-ROM, etc.) for storing executable instructions that when executed perform the inventive steps described herein for controlling a direct current gain of a resonant converter to increase power efficiency within a circuit. The memory 1005 also stores the data associated with or generated by the execution of the inventive steps.

Figure 11:
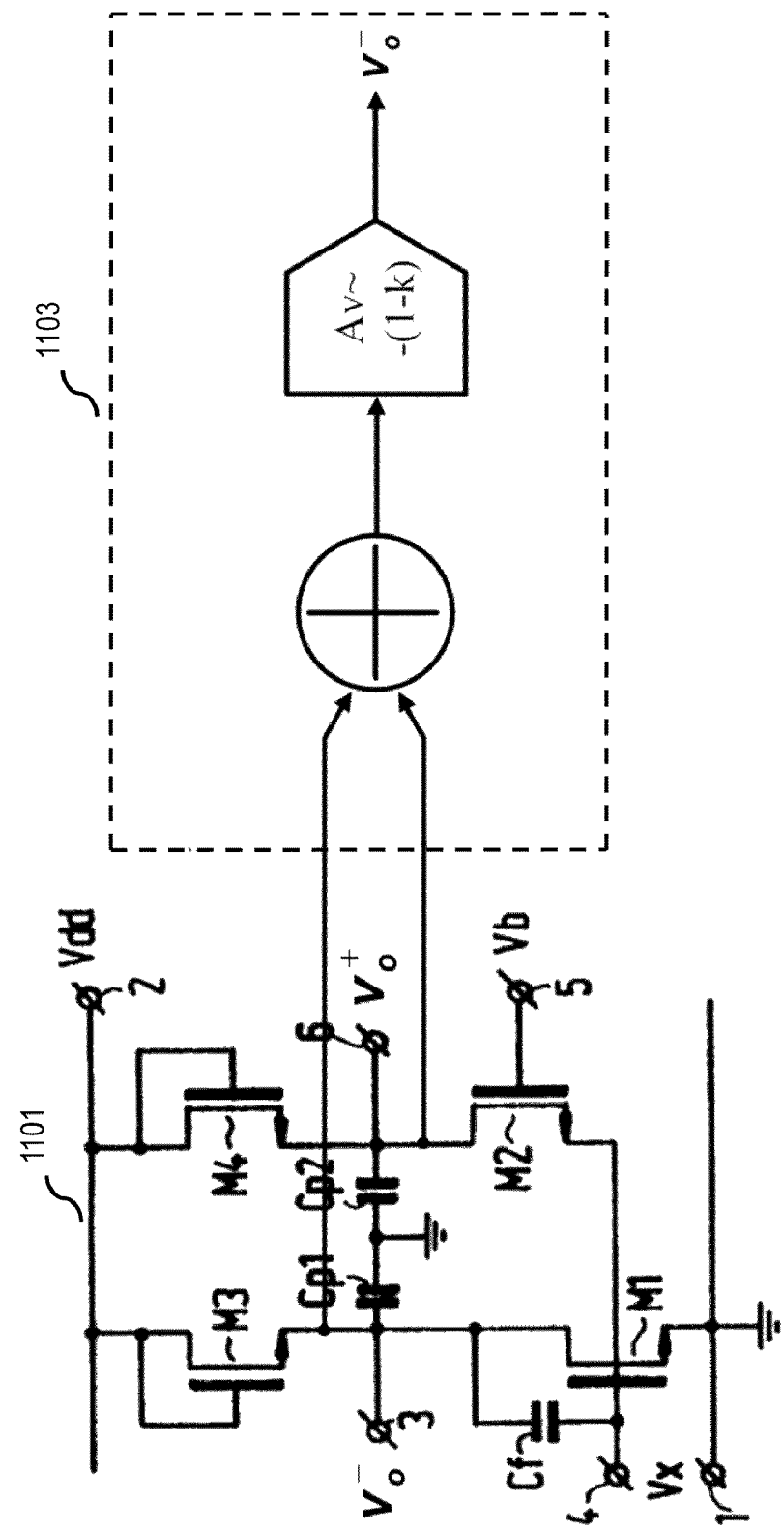
FIG. 11 is a block diagram of a conventional single-ended to differential buffer and a control module applying the summing and scaling approach.

FIG. 11 is a block diagram 1100 of a conventional single-ended to differential buffer 1101 and a control module 1103 applying the summing and scaling approach, according to one embodiment.

By way of example, the conventional single-ended to differential buffer 1101 uses a pair of common-gate (CG) common-source (CS) amplifiers M1, M2 as an input stage. The amplifier utilizes the CG-CS amplifiers as the input stage and generates differential output. Two diode-connected MOS transistors M3, M4 are used as the loads to convert the output current into a voltage. This topology provides a relatively high linearity yet poor NF. With the addition of the control module 1103, the NF can be reduced significantly, based on the above-discussed summing and scaling approach and circuit topologies.

Figure 12:
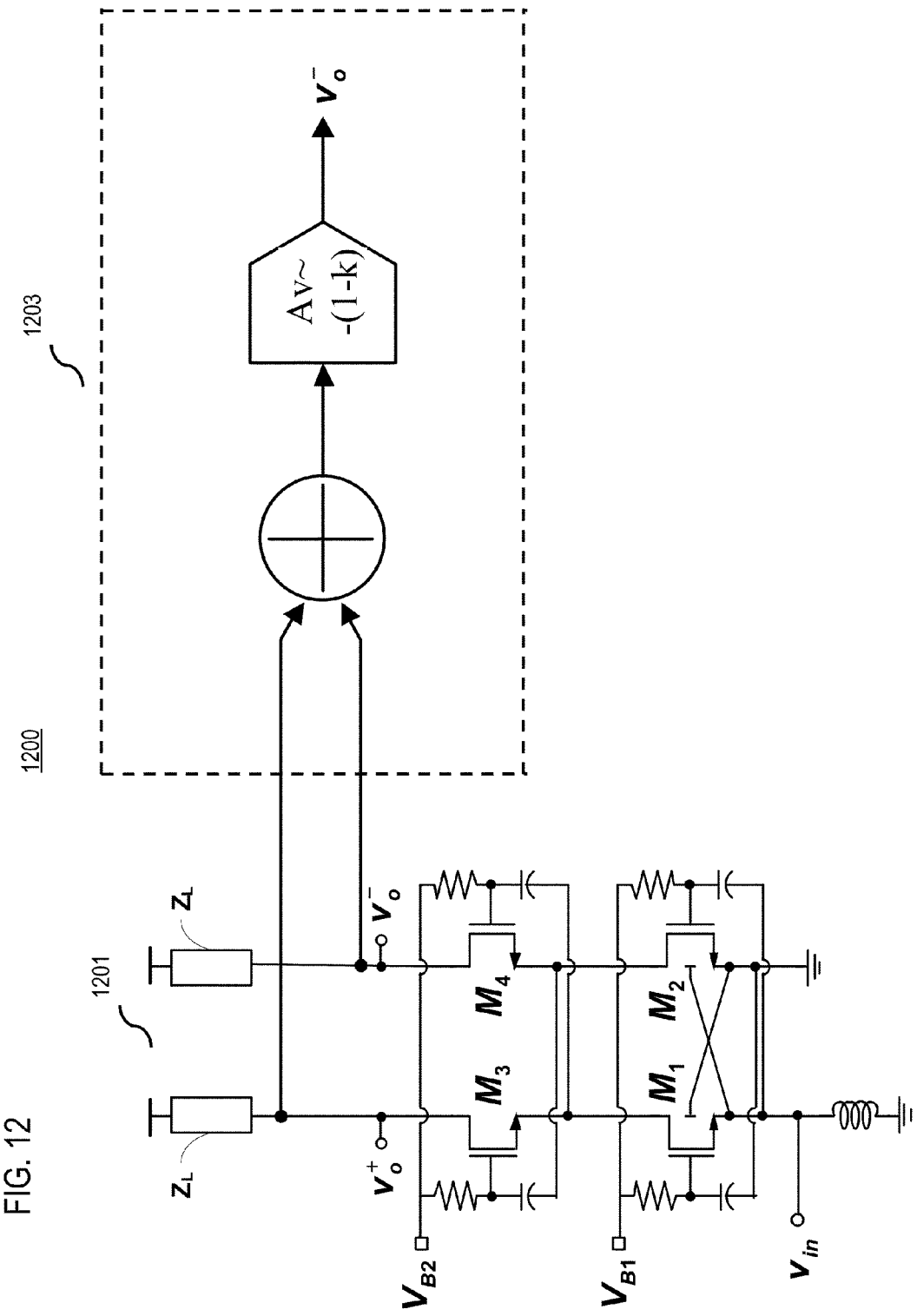
FIG. 12 is a block diagram of another conventional single-ended to differential LNA and a control module applying the summing and scaling approach.

FIG. 12 is a block diagram 1200 of another conventional single-ended to differential LNA 1201 and a control module 1203 applying the summing and scaling approach, according to one embodiment.

By way of example, the conventional single-ended to differential LNA 1201 uses the common-gate (CG) common-source (CS) amplifiers as an input stage. It also employs CG-CS amplifiers as the input stage and generates a differential output. Two additional techniques are applied to improve circuit performance such as NF, linearity, and differential balance. This current buffer also provides bulk cross-coupling that provides higher gain and lower NF, and enhances $g_m$ without introducing extra DC current. However, it requires two stages in cascode which is difficult to implement for ultra low voltage (ULV) operations. With the addition of the control module 1203, the NF can be reduced significantly, based on the above-discussed summing and scaling approach and circuit topologies.

In one embodiment, the summing and scaling approach is implemented under the assumption that $g_{m,CG}=g_{m,CS}$. In another embodiment, $g_{m,CS}$ is larger than $g_{m,CG}$. The proposed summing and scaling approach is still valid to effectively reduce NF with careful design parameters.

Many modifications and other embodiments as set forth herein will come to mind to one skilled in the art to which these inventions pertain having the benefit of the teachings presented in the foregoing descriptions and the associated drawings. Therefore, it is to be understood that the embodiments are not to be limited to the specific examples disclosed and that modifications and other embodiments are intended to be included within the scope of the claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the claims. In this regard, for example, different combinations of elements and/or functions than those explicitly described above are also contemplated within the scope of the claims. Although specific terms are employed herein, they are used in a generic and descriptive sense only and not for purposes of limitation.

What is claimed is:

1. A method for cancelling balun amplifier noise, comprising:
summing and scaling an output from a current-sensing branch of an amplifier and an output from a voltage sensing branch of the amplifier into one or more summed and scaled outputs; and
feeding the one or more summed and scaled outputs back to at least one of the outputs of the branches of the amplifier.

2. A method of claim 1, wherein the summing and scaling includes summing the outputs from the branches and then scaling a summed result with a factor, or scaling each of the outputs from the branches with a factor and then summing scaled results.

3. A method of claim 2, wherein the outputs from the branches are summed using one or more inductors, one or more capacitors, one or more resistors, one or more transistors, or a combination thereof.

4. A method of claim 2, wherein the outputs from the branches are scaled using one or more amplifiers.

5. A method of claim 1, wherein the feeding back includes feeding back a positive one of the one or more summed and scaled outputs to a positive one of the outputs of the branches of the amplifier, feeding back a negative one of the one or more summed and scaled outputs to a negative one of the outputs of the branches of the amplifier, or a combination thereof.

6. A method of claim 1, wherein a negative one of the outputs of the branches of the amplifier has an inverting phase from an input of the amplifier, and a negatively scaled one of the one or more summed and scaled outputs is fed back to the negative output.

7. A method of claim 1, wherein a positive one of the outputs of the branches of the amplifier is in phase or substantially in phase with respect to an input of the amplifier, and a positively scaled one of the one or more summed and scaled outputs is fed back to the positive output.

8. An apparatus for cancelling balun amplifier noise, comprising:
a current sensing amplifier;
a voltage sensing amplifier; and
a control module which sums and scales an output from the current sensing amplifier and an output from the voltage sensing amplifier, and the control module feeds one or more summed and scaled outputs back to at least one of the outputs of the current and sensing voltage amplifiers.

9. An apparatus of claim 8, wherein the control module is configured to sum the outputs from the branches and then scale a summed result with a factor, or to scale each of the outputs from the branches with a factor and then sum scaled results, or to sum and scale with a factor currently the outputs from the branches.

10. An apparatus of claim 9, further comprising:
one or more inductors, one or more capacitors, one or more resistors, one or more transistors, or a combination thereof, wherein the control module is configured to sum the outputs from the branches using the one or more inductors, the one or more capacitors, the one or more resistors, the one or more transistors, or a combination thereof.

11. An apparatus of claim 9, further comprising:
one or more amplifiers, wherein the control module is configured to scale the outputs from the branches using the one or more amplifiers.

12. An apparatus of claim 8, wherein the control module is configured to feed a positive one of the one or more summed and scaled outputs back to a positive one of the outputs of the branches of the amplifier, to feed a negative one of the one or more summed and scaled outputs back to a negative one of the outputs of the branches of the amplifier, or a combination thereof.

13. An apparatus of claim 8, wherein the voltage sensing amplifier is configured to invert an input of the amplifier into a negative one of the outputs of the branches of the amplifier, and the control module is configured to feed a negatively scaled one of the one or more summed and scaled outputs back to the negative output.

14. An apparatus of claim 8, wherein the current sensing amplifier is configured to maintain a phase of a positive one of the outputs of the branches of the amplifier identical with an input of the amplifier, and the control module is configured to feed a positively scaled one of the one or more summed and scaled outputs back to the positive output.

15. An apparatus of claim 8, wherein the apparatus includes a low noise amplifier (LNA).

16. An apparatus of claim 8, wherein the apparatus includes one or more single-stage common-gate and common-source balun amplifiers, one or more balun amplifiers each with a current-sensing amplifier and a voltage-sensing amplifier, one or more balun amplifiers each with a post-stage of amplifiers, or a combination thereof.

17. An apparatus for cancelling balun amplifier noise, comprising:
at least one processor; and
at least one memory including computer program code for one or more programs,
the at least one memory and the computer program code configured to, with the at least one processor, cause the apparatus to perform at least the following,
sum and scale an output from a current-sensing branch of an amplifier and an output from a voltage sensing branch of the amplifier into one or more summed and scaled outputs; and
feed the one or more summed and scaled outputs back to at least one of the outputs of the branches of the amplifier.

18. An apparatus of claim 17, wherein the apparatus is further caused to sum the outputs from the branches and then scale a summed result with a factor, or to scale each of the outputs from the branches with a factor and then to sum scaled results, or to sum and scale with a factor currently the outputs from the branches.

19. An apparatus of claim 18, wherein the apparatus is further caused to sum the outputs from the branches using one or more inductors, one or more capacitors, one or more resistors, one or more transistors, or a combination thereof.

20. An apparatus of claim 18, wherein the apparatus is further caused to scale the outputs from the branches using one or more amplifiers.

* * * * *